(12) United States Patent
Babich et al.

(10) Patent No.: US 7,998,871 B2
(45) Date of Patent: *Aug. 16, 2011

(54) MASK FORMING AND IMPLANTING METHODS USING IMPLANT STOPPING LAYER

(75) Inventors: Katherina Babich, Chappaqua, NY (US); Todd C. Bailey, Poughkeepsie, NY (US); Richard A. Conti, Katonach, NY (US); Ryan P. Deschner, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

This patent is subject to a terminal disclaimer.

(21) Appl. No.: 12/145,915

(22) Filed: Jun. 25, 2008

(65) Prior Publication Data

US 2009/0004869 A1 Jan. 1, 2009

Related U.S. Application Data

(62) Division of application No. 11/420,321, filed on May 25, 2006, now Pat. No. 7,651,947.

(51) Int. Cl.
*H01L 21/302* (2006.01)
(52) U.S. Cl. ......... 438/705; 438/712; 438/717; 438/736
(58) Field of Classification Search .................. 438/705, 438/712, 717, 736
See application file for complete search history.

(56) References Cited

U.S. PATENT DOCUMENTS

| 5,094,929 A * | 3/1992 | Yagi et al. ........... 430/60 |
| 5,795,810 A | 8/1998 | Houston |
| 6,881,638 B1 | 4/2005 | Gau |
| 7,422,966 B2 | 9/2008 | Forbes et al. |
| 7,651,947 B2 * | 1/2010 | Babich et al. ......... 438/705 |
| 2002/0012876 A1 * | 1/2002 | Angelopoulos et al. ... 430/271.1 |

(Continued)

FOREIGN PATENT DOCUMENTS

CN 1514472 7/2004

OTHER PUBLICATIONS

XiaoMing Yang et al. "Electron Beam Lithography Method for Sub-50 nm Isolated Trench With High Aspect Ratio" ; http://www2.egr.uh.edu/~ecnfg/16.pdf ; 10 pages; no date available.*

(Continued)

*Primary Examiner* — Binh X Tran
(74) *Attorney, Agent, or Firm* — Wenji Li; Hoffman Warnick LLC

(57) ABSTRACT

Methods of forming a mask for implanting a substrate and implanting using an implant stopping layer with a photoresist provide lower aspect ratio masks that cause minimal damage to trench isolations in the substrate during removal of the mask. In one embodiment, a method of forming a mask includes: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask. The implant stopping layer may include: hydrogenated germanium carbide, nitrogenated germanium carbide, fluorinated germanium carbide, and/or amorphous germanium carbon hydride (GeHX), where X includes carbon. The methods/mask reduce scattering during implanting because the mask has higher density than conventional masks.

11 Claims, 6 Drawing Sheets

U.S. PATENT DOCUMENTS

2004/0188684 A1    9/2004  Glass et al.
2006/0063338 A1*   3/2006  Menon et al. ............ 438/296
2006/0063376 A1    3/2006  Lee et al.

OTHER PUBLICATIONS

U.S. Appl. No. 11/420,321, Office Action dated May 13, 2009.
Babich et al., U.S. Appl. No. 12/145,922, Response to Office Action dated Mar. 11, 2009, filed Jun. 11, 2009.
U.S. Appl. No. 12/145, 922, Office Action dated Mar. 11, 2009.
U.S. Appl. No. 11/420,321, Office Action 1, Nov. 25, 2008.
U.S. Appl. No. 12/145,922, filed Jun. 25, 2008, Notice of Abandonment dated Oct. 7, 2009.
U.S. Appl. No. 11/420,321, filed May 25, 2006, Notice of Allowance and Fees Due dated Sep. 11, 2009.
U.S. Appl. No. 12/145,922, filed Jun. 25, 2008, Notice of Allowance and Fees Due dated Jun. 22, 2009.

* cited by examiner

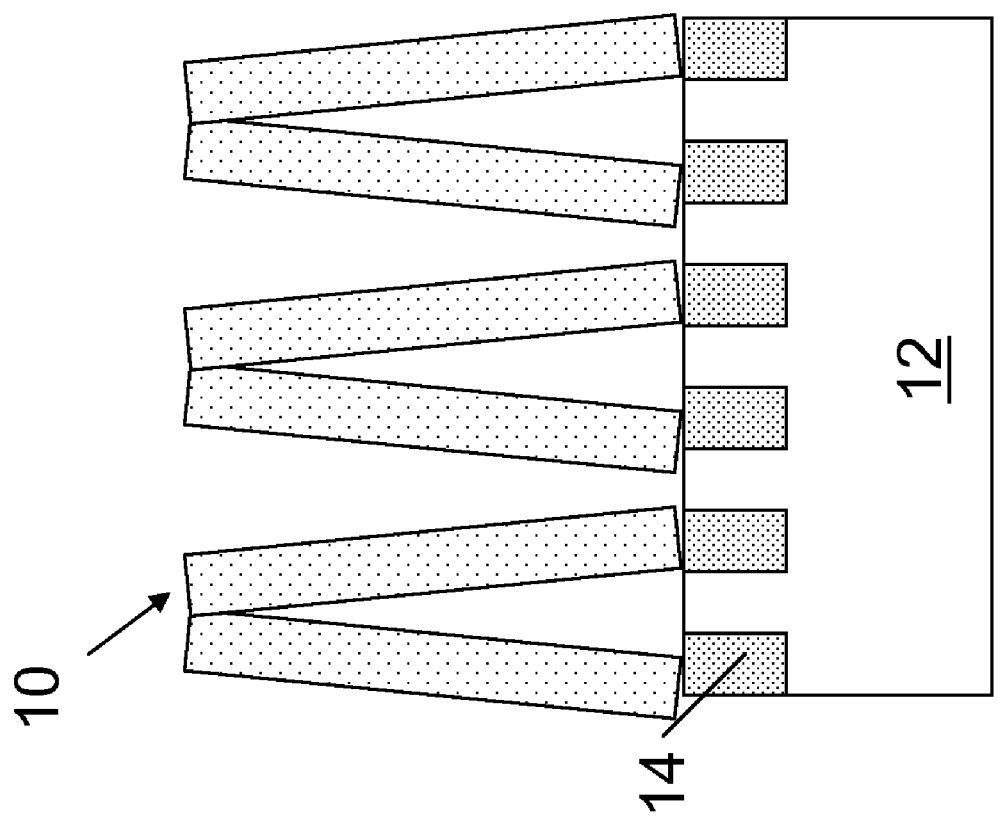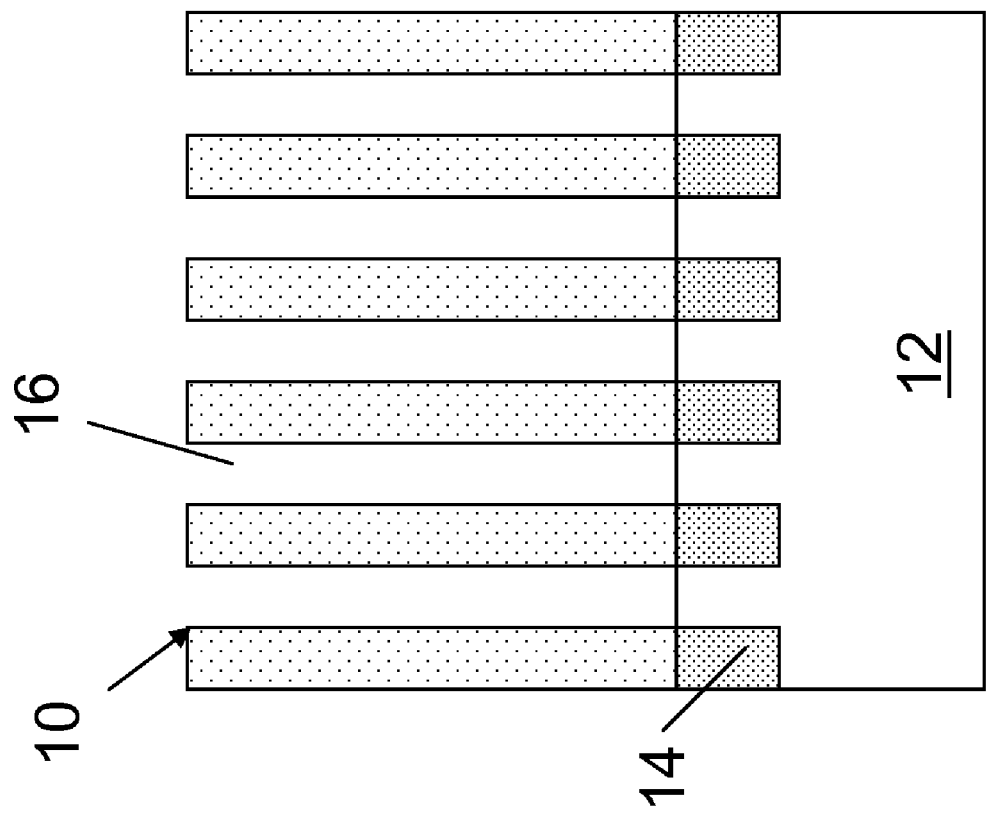

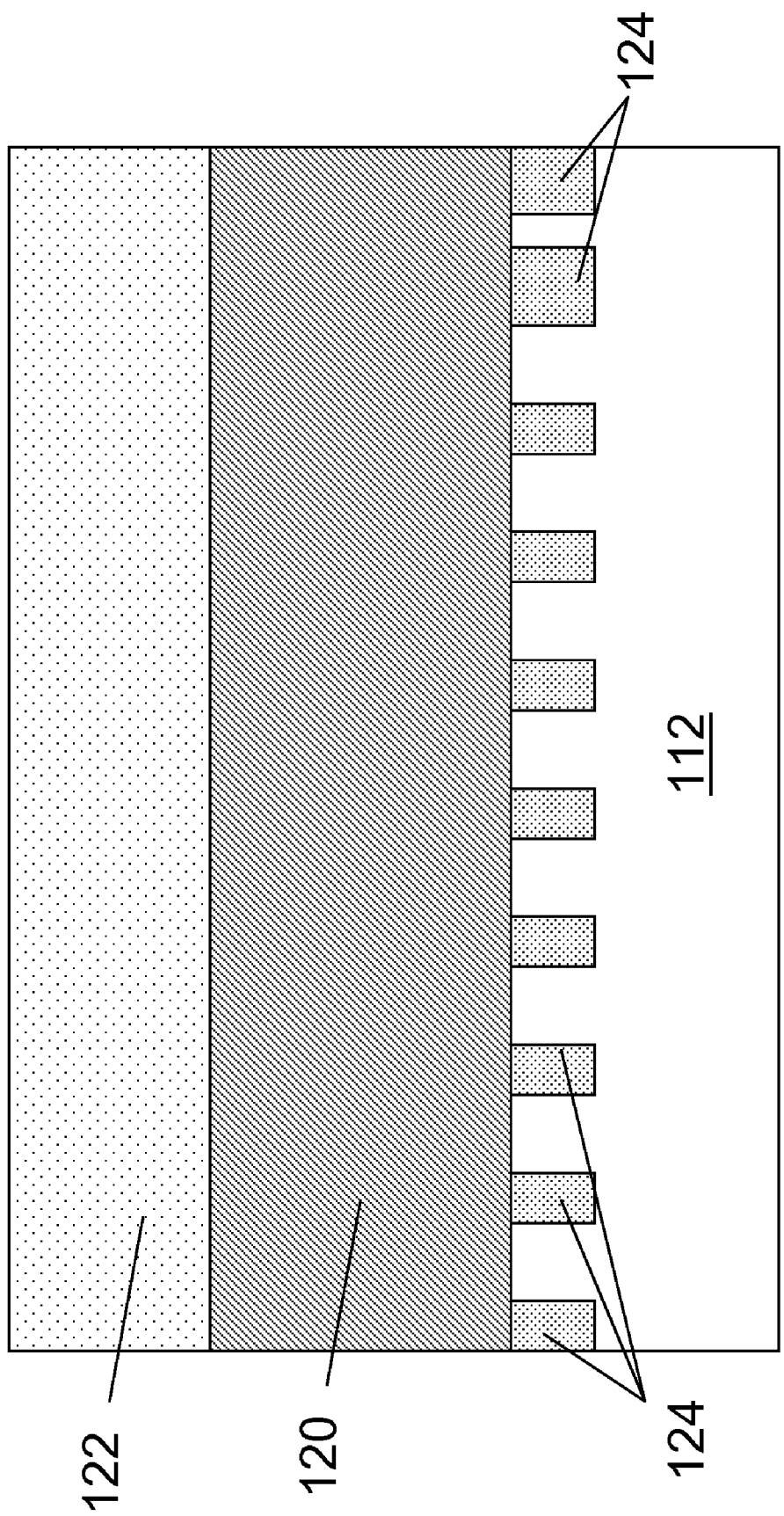

MASK FORMING AND IMPLANTING METHODS USING IMPLANT STOPPING LAYER

This application is a divisional application of U.S. Ser. No. 11/420,321, filed May 25, 2006, now U.S. Pat. No. 7,651,947 B2.

BACKGROUND OF THE INVENTION

1. Technical Field

The invention relates generally to semiconductor device fabrication, and more particularly, to a method for forming a mask for implanting a substrate, where the mask includes an implant stopping layer, and a mask so formed.

2. Background Art

In the semiconductor fabrication industry continual miniaturization of structures presents challenges relative to modifying current techniques. One challenge is addressing problems related to photolithography. Photolithography is a process used in the semiconductor fabrication industry in which a photo-sensitive material, i.e., a photoresist, is laid upon a substrate, imaged and then etched to leave a pattern that can be used to generate other structures within the substrate. As miniaturization continues, the dimensions of patterned photoresists are also being minimized. Some processing, for example, deep well ion implants, require very thick layers of photoresist to block ion implantation into areas under the photoresist in which the implantation is not desired. These patterned single layer photoresists have a relatively high aspect ratio, i.e., patterned photoresist height to patterned line width, and, as a result, are subject to collapse. For example, FIG. 1 shows a conventional patterned photoresist 10 over a substrate 12 having trench isolations 14 therein. Patterned photoresist 10 has a relatively high aspect ratio. As shown in FIG. 2, patterned photoresist 10 is subject to capillary-induced line collapses in which capillary action within patterned openings 16 (FIG. 1) draws the photoresist inwardly and causes a collapse.

One approach to address this situation has been to employ hard masks having two layers, one layer including silicon oxide and/or silicon nitride to block the ion implantation. While bilayer photoresist masks have lower aspect ratios compared to single layer masks, during removal of these bilayer masks, trench isolations 14 (FIG. 2) within substrate 12, which typically include silicon oxide and/or silicon nitride based materials, can be degraded because the etching chemistry used to remove the hard mask is also effective on the trench isolation. In addition, these conventional bilayer photoresist masks must be inorganic, which prevents use of a wide variety of organic photoresists. In addition, the total density of the photoresist mask leads to ion scattering, which causes proximity effects in neighboring devices.

In view of the foregoing, there is a need in the art for a solution to the problems of the related art.

SUMMARY OF THE INVENTION

Methods of forming a mask for implanting a substrate and implanting using an implant stopping layer with a photoresist provide lower aspect ratio masks that cause minimal damage to trench isolations in the substrate during removal of the mask. In one embodiment, a method of forming a mask includes: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask. The implant stopping layer may include: hydrogenated germanium carbide, nitrogenated germanium carbide, fluorinated germanium carbide, and/or amorphous germanium carbon hydride (GeHX), where X includes carbon. The methods/mask reduce scattering during implanting because the mask has higher density than conventional masks.

A first aspect of the invention provides a method of forming a mask for implanting a substrate, the method comprising the steps of: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask.

A second aspect of the invention provides a mask comprising: an implant stopping layer over a substrate, wherein the implant stopping layer includes at least one of hydrogenated germanium carbide, nitrogenated germanium carbide, fluorinated germanium carbide and amorphous germanium carbon hydride (GeHX), where X includes carbon; and a photoresist over the implant stopping layer.

A third aspect of the invention provides a method of implanting a substrate, the method comprising the steps of: depositing an implant stopping layer over the substrate, wherein the implant stopping layer includes at least one of: hydrogenated germanium carbide, nitrogenated germanium carbide, fluorinated germanium carbide, and amorphous germanium carbon hydride (GeHX), where X includes carbon; depositing a photoresist over the implant stopping layer, the implant stopping layer having a density greater than the photoresist; forming a pattern in the photoresist by removing a portion of the photoresist to expose the implant stopping layer; transferring the pattern into the implant stopping layer by etching to form the mask; and implanting the substrate.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1 and 2 show a conventional photoresist mask.

FIGS. 3-5 show steps of a method of forming a mask according to one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 4:
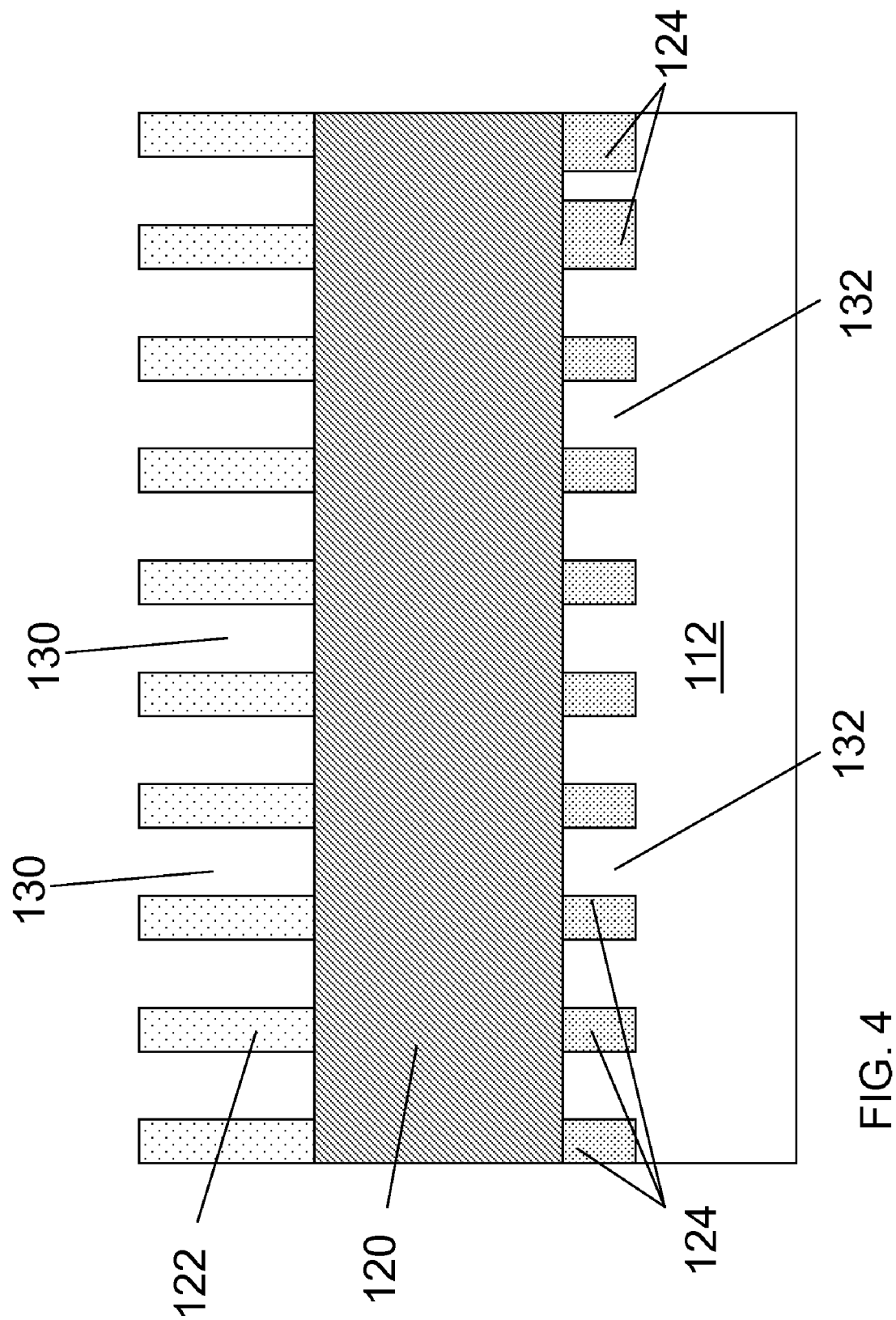
Figure 5:
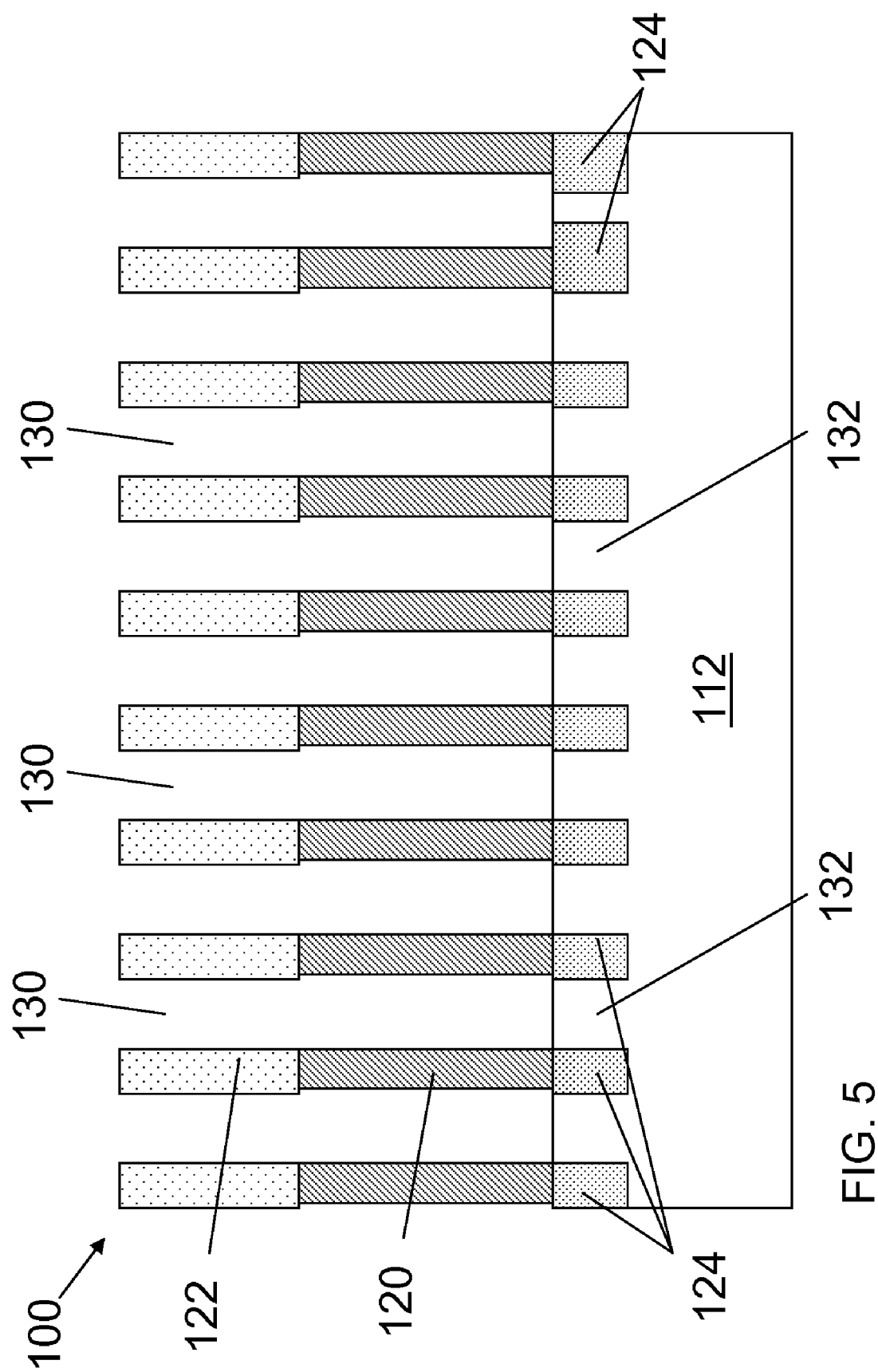

Turning to FIGS. 3-5, one embodiment of a method of forming a mask 100 (FIG. 5) for implanting a substrate 112 is illustrated. As shown in FIG. 3, a first step includes depositing an implant stopping layer 120 over substrate 112, followed by deposition of a photoresist 122 over implant stopping layer 120. Each layer may be deposited using any now known or later developed process. In one embodiment, however, ion implant stopping layer 120 is deposited by at least one of: chemical vapor deposition (CVD), low-pressure CVD (LPCVD), plasma-enhanced CVD (PECVD), semi-atmosphere CVD (SACVD) and high density plasma CVD (HD-PCVD), rapid thermal CVD (RTCVD), ultra-high vacuum CVD (UHVCVD), sputtering deposition, ion beam deposition, electron beam deposition, and laser assisted deposition. Implant stopping layer 120 may have a depth that is greater than a depth of photoresist 122. Substrate 112 may include any now known or later developed substrate material such as one or more of the following: a semiconductor (e.g., silicon, silicon germanium (SiGe), a dielectric, a glass, a metal, non-metallic conductor, magnetic material and a polymer. In addition, substrate 112 may include trench isolations 124 of, for example, silicon oxide, for electrically separating devices to be generated on substrate 112.

Implant stopping layer 120 has a density sufficient to stop ion implanting from reaching substrate 112, as will be described in greater detail below. That is, implant stopping layer 120 has a density greater than photoresist 122. Hence, implant stopping layer 120 is not used as a conventional bilayer masking process because its higher density allows for thinning of the stack compared to conventional bilayer or single resist schemes. In one embodiment, implant stopping layer 120 includes at least one of the following: hydrogenated germanium carbide, nitrogenated germanium carbide, fluorinated germanium carbide, and amorphous germanium carbon hydride (GeHX), where X includes carbon. Implant stopping layer 120 may be deposited from a precursor including, for example, at least one of: germane, alkyl germane, alkoxy germane, acyloxy germane, aryl germane, cyclicgermanes, nitrogen, carbon, and fluorine. In one embodiment, implant stopping layer 120 may be deposited from tetramethylgermane in a reactor at a pressure of approximately 0.1 Torr to approximately 50 Torr, and substrate 112 at a temperature of approximately 200° C. to approximately 500° C. In an alternative embodiment, implant stopping layer 120 may be deposited from germane in the presence of ethylene and/or acetylene in a reactor at a pressure of approximately 0.1 Torr to approximately 50 Torr, and substrate 112 at a temperature of approximately 200° C. to approximately 500° C. Other techniques may also be employed.

Photoresist 122 may include inorganic photoresist material or organic photoresist material, i.e., including carbon (C). In any event, photoresist 122 is photosensitive to, for example, i-line, g-line, 248 nm, 193 nm, 157 nm, 126 nm, extreme ultraviolet radiation, electron beam, x-ray irradiation and combinations thereof.

Next, as shown in FIG. 4, a pattern 130 (e.g., openings) may be formed by removing a portion(s) of photoresist 122 to expose implant stopping layer 120 in any now known or later developed fashion, e.g., patterning photoresist 122, exposing it to radiation, and etching to create pattern 130. The etching may include, for example, a wet etching. Pattern 130 may be aligned with openings 132 between trench isolations 124, i.e., with the appropriate well definition pattern, such that ion implantation may occur between trench isolations 124. However, this is not necessary.

In FIG. 5, pattern 130 is transferred into implant stopping layer 120 by etching using patterned photoresist 122 to complete mask 100. In one embodiment, the etching may include RIE. For example, the transferring may include removing a portion of implant stopping layer 120 by reactive ion etching in a plasma containing one or more reactive species selected from the group consisting of fluorine (Fl), fluorocarbon, chlorine (Cl), bromine (Br), oxygen ($O_2$), carbon monoxide (CO) and carbon dioxide ($CO_2$). Other techniques, however, are also possible. Patterned photoresist 122 and patterned implant stopping layer 120 collectively have an aspect ratio of, for example, less than approximately 4.0. However, the invention is not limited to that aspect ratio. That is, they are collectively thinner than conventional bilayer photoresists structures.

Figure 6:
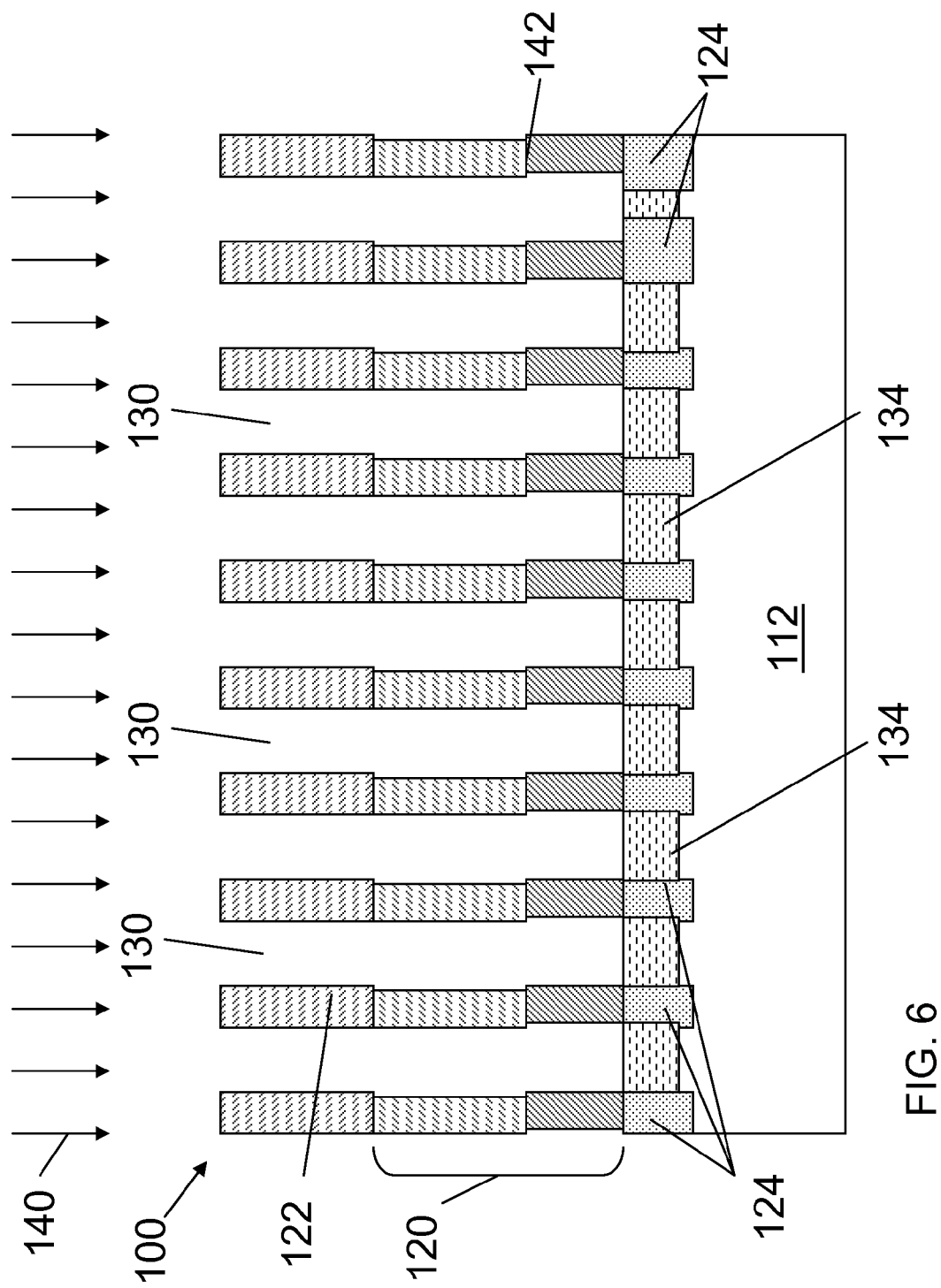
FIG. 6 shows use of the mask of FIG. 5 for implanting a substrate according to another embodiment of the invention.

In FIG. 6, an ion implant 140 is conducted using mask 100. At this stage, mask 100 includes implant stopping layer 120 over substrate 112, and photoresist 122 over implant stopping layer 120. Implant stopping layer 120 includes at least one of hydrogenated germanium carbide, nitrogenated germanium carbide, fluorinated germanium carbide and amorphous germanium carbon hydride (GeHX), where X includes carbon. As indicated, ion implantation reaches substrate 112, in regions 134 between trench isolations 124, via pattern 130 through photoresist 122 and implant stopping layer 120. However, ion implantation is stopped at a location 142 within implant stopping layer 120 above substrate 112. Implantation into mask 100 exhibits less scattering than conventional processes, which allows for reduction of a threshold voltage shift of devices subsequently generated. Implant 140 may include, for example, a well, halo, extension, deep source/drain ion implantation process. It is understood that implant stopping layer 120 and trench isolations 124 may not have identical widths. For example, the far right trench isolations 124 in FIGS. 3-7 show how trench isolations 124 may be wider. Additionally, it is understood that implant stopping layer 120 may be designed to cover some portion of substrate 112 that is not intended to be receive ion implant 140.

Figure 7:
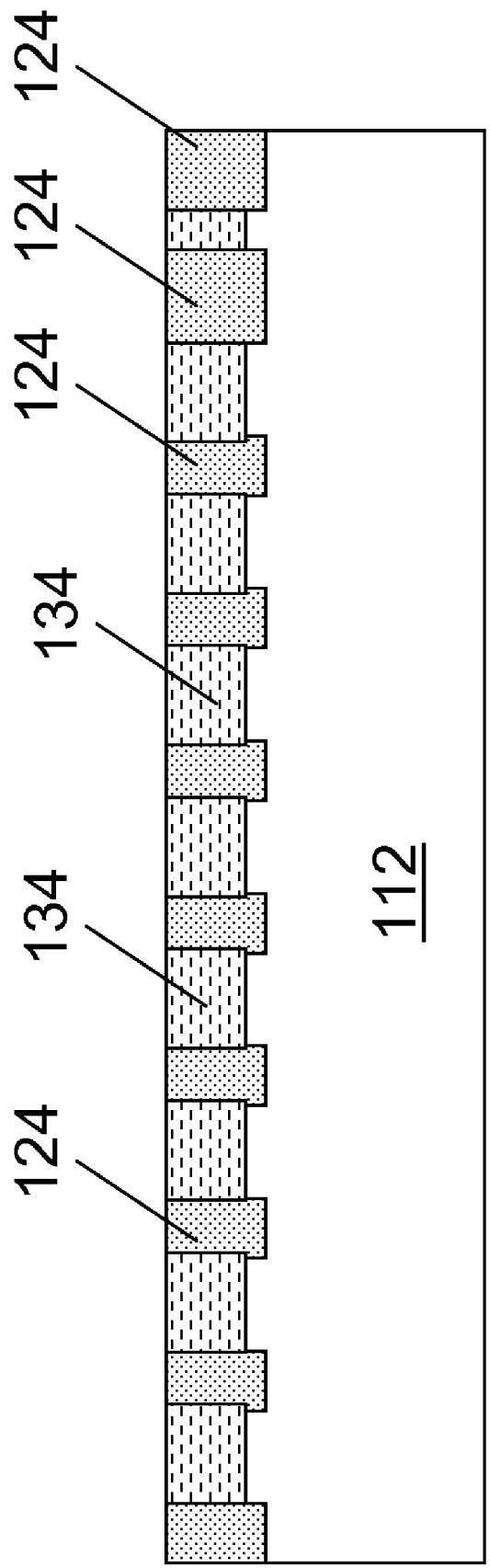
FIG. 7 shows the implanted substrate.

FIG. 7 shows a next step of removing photoresist 122 and implant stopping layer 120 after implanting using mask 100. The removing step may use any conventional processes. One advantage, however, of implant stopping layer 120 removal is that the particular chemistries used cause minimal damage to trench isolations 124. Substrate 112, as shown, may be used to generate semiconductor devices thereon in any now known or later developed fashion.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a mask for implanting a substrate, the method comprising the steps of:

depositing an implant stopping layer over the substrate, wherein the substrate includes at least one trench isolation;

depositing a photoresist over the implant stopping layer, the implant stopping layer having a density and a vertical depth greater than a density and a vertical depth of the photoresist;

forming a pattern in the photoresist by wet etching to remove a portion of the photoresist to expose portions of the implant stopping layer; and transferring the pattern into the exposed portions of the implant stopping layer by reactive ion etching using the patterned photomask to form the mask, wherein a portion of the implant stopping layer remains over and abutting the at least one trench isolation after the transferring.

2. The method of claim 1, wherein the implant stopping layer depositing includes depositing from germane in the presence of at least one of the following: ethylene and acetylene, in a reactor at a pressure of approximately 0.1 Torr to approximately 50 Torr, and the substrate at a temperature of approximately 200° C. to approximately 500° C.

3. The method of claim 1, wherein the patterned photoresist and the patterned implant stopping layer collectively have an aspect ratio of less than approximately 4.0.

4. The method of claim 1, wherein the implant stopping layer includes at least one of: hydrogenated germanium carbide, itrogenated germanium carbide, fluorinated germanium carbide, and amorphous germanium carbon hydride (GeHX), where X includes carbon.

5. The method of claim 1, further comprising implanting the substrate, wherein the substrate further includes a plurality of trench isolations, the implanting of the substrate including ion implanting in at least one region of the substrate between the plurality of trench isolations.

6. The method of claim 5, wherein the implant stopping layer pattern prevents the ion implanting in at least one region of the substrate below at least one of the plurality of trench isolations.

7. A method of implanting a substrate, the method comprising the steps of:
    depositing an implant stopping layer over the substrate, wherein the implant stopping layer includes at least one of: hydrogenated germanium carbide, nitrogenated germanium carbide, fluorinated germanium carbide, and amorphous germanium carbon hydride (GeHX), where X includes carbon, and wherein the substrate includes at least one trench isolation;
    depositing a photoresist over the implant stopping layer, the implant stopping layer having a density greater than the photoresist;
    forming a pattern in the photoresist by wet etching to remove a portion of the photoresist to expose portions of the implant stopping layer;
    transferring the pattern into the exposed portions of the implant stopping layer by etching using the patterned photomask to form the mask, wherein a portion of the implant stopping layer remains over and abutting the at least one trench isolation after the transferring; and
    implanting the substrate.

8. The method of claim 7, wherein the implant stopping layer depositing includes depositing from germane in the presence of at least one of the following: ethylene and acetylene, in a reactor at a pressure of approximately 0.1 Torr to approximately 50 Torr, and the substrate at a temperature of approximately 200° C. to approximately 500° C.

9. The method of claim 7, wherein the patterned photoresist and the patterned implant stopping layer collectively have an aspect ratio of less than approximately 4.0.

10. The method of claim 7, further comprising implanting the substrate, wherein the substrate further includes a plurality of trench isolations, the implanting of the substrate including ion implanting in at least one region of the substrate between the plurality of trench isolations.

11. The method of claim 10, wherein the implant stopping layer pattern prevents the ion implanting in at least one region of the substrate below at least one of the plurality of trench isolations.

* * * * *